United States Patent [19]
Shikata et al.

[11] Patent Number: 5,497,726
[45] Date of Patent: Mar. 12, 1996

[54] METHOD OF MANUFACTURING A SURFACE ACOUSTIC WAVE ELEMENT

[75] Inventors: Shinichi Shikata; Akihiro Hachigo; Hideaki Nakahata; Kenjiro Higaki, all of Hyogo, Japan

[73] Assignee: Sumitomo Electric Industries, Ltd., Osaka, Japan

[21] Appl. No.: 240,826

[22] Filed: May 11, 1994

Related U.S. Application Data

[62] Division of Ser. No. 117,226, Sep. 3, 1993, Pat. No. 5,343,107.

[30] Foreign Application Priority Data

Sep. 11, 1992 [JP] Japan ................................ 4-243319

[51] Int. Cl.⁶ ................... C30B 23/04; C30B 29/04; C30B 29/02
[52] U.S. Cl. ................ 117/89; 117/95; 117/104; 117/928; 117/929
[58] Field of Search .................... 117/929, 928, 117/89, 104, 95

[56] References Cited

U.S. PATENT DOCUMENTS

| | | |
|---|---|---|
| 4,952,832 | 8/1990 | Imai et al. . |
| 5,221,870 | 6/1993 | Nakahata et al. ............ 310/313 A |

FOREIGN PATENT DOCUMENTS

| | | |
|---|---|---|
| 0407163 | 1/1991 | European Pat. Off. . |
| 54-38874 | 3/1979 | Japan . |
| 64-62911 | 3/1989 | Japan . |
| 3-40510 | 2/1991 | Japan . |
| 03126697 | 5/1991 | Japan . |

OTHER PUBLICATIONS

Burns et al, "Epitaxial Growth of Copper–Nickel Single Crystal Alloys and Multilayers by M. B. E", Mater. Res. Soc. Symp. Proc. (1990) 203–8 abs only.

Diamond and Related Materials, by M. W. Geis "Device quality diamond substrates" vol. 1, 1992 pp. 684–687.

Textured Growth and Twinning in Polycrystalline CVD Diamond Film by Wild et al. Int. Symposium, Diamond Material, 1991 p. 224.

CVD Copper Mettalurgy for ULSI Interconnections by Arita et al. IEEE IEDM 90 pp. 39–42 & 286 IEDM p. 91.

Large–Electromigration–Resistance Copper Interconnect Technology for Sub–Half–Micron ULSI's by Ohmi et al. 1991 IEEE IEDM 91–285, 287, 288.

*Primary Examiner*—Robert Kunemund
*Attorney, Agent, or Firm*—W. G. Fasse; W. F. Fasse

[57] ABSTRACT

A surface acoustic wave element has a diamond layer, a piezoelectric thin film formed on the diamond layer, and a pair of electrodes for generating a surface acoustic wave having a specific wavelength and extracting the surface acoustic wave, wherein at least one electrode is a copper electrode epitaxially grown on the surface of the diamond layer. To manufacture this surface acoustic wave element, after the diamond layer is formed on a substrate by epitaxial growth, the copper electrodes each having the predetermined shape are formed on the surface of the diamond layer by epitaxial growth. Since the copper electrodes formed on the diamond layer consist of high-quality single crystal copper, resistances to electromigration and stress migrations can be increased. As a result, there is provided an excellent surface acoustic wave element free from electrical defects caused by degradation and failure of the copper electrodes or free from degradation of the electrical characteristics.

16 Claims, 4 Drawing Sheets

Cu(hfa)$_2$

[In the above formula, "hfa" means hexafluoroacetyl acetate.]

METHOD OF MANUFACTURING A SURFACE ACOUSTIC WAVE ELEMENT

CROSS REFERENCE TO RELATED APPLICATION

This application is a divisional of U.S. Ser. No. 08 117,226, filed Sep. 3, 1993, and issued as U.S. Pat. No. 5,343,107 on Aug. 30, 1994

BACKGROUND OF THE INVENTION

1. Field of the Invention

The present invention relates to a method of manufacturing a surface acoustic wave element, for example to be used in a high-frequency filter and, more particularly, relates to a surface acoustic wave element using diamond.

2. Related Background Art

A surface acoustic wave element is an electro-mechanical conversion element utilizing a surface wave propagating on the surface of an elastic body and has interdigital transducer (IDT) electrodes on a piezoelectric body. When an electrical signal is applied to one IDT, the piezoelectric body is stressed, and this stress becomes a surface acoustic wave. The surface acoustic wave propagates on the piezoelectric body and is extracted as an electrical signal at the other IDT. In this manner, in the surface acoustic wave element, the piezoelectric phenomenon of the piezoelectric body is used in exciting the surface acoustic wave.

The frequency characteristics of the surface acoustic wave element are given as band passing characteristics having, as a center frequency, a frequency $f_0$ proportional to a ratio $V/\lambda_0$ of a propagation velocity V of the surface acoustic wave to a wavelength $\lambda_0$ of the segments of each IDT.

A surface acoustic wave element requires a smaller number of parts and can be made compact as compared to other electronic elements for performing similar functions. In addition, signals can be easily input and output on a surface acoustic wave propagation path. This element can be used in a variety of applications such as a filter, a delay line, an oscillator, a convolver, or a correlator.

In particular, a surface acoustic wave filter has been used as an intermediate frequency (IF) television filter from the early period of its application. Such surface acoustic wave filters have also been applied in VTRs and various communication equipment filters.

This surface acoustic filter has been manufactured such that an interdigital transducer is formed on a monocrystalline piezoelectric material such as $LiNbO_3$ or $LiTaO_3$. A surface acoustic wave element having a piezoelectric thin film made of ZnO or the like sputtered on a substrate of glass is also used.

In recent years, an element to be used at a higher frequency is required in a surface acoustic wave filter used in the fields of mobile communications and the like. As described above, when the electrode wavelength $\lambda_0$ decreases or the surface acoustic wave velocity V increases, the frequency characteristics of the element have a higher center frequency $f_0$.

Under the above circumstances, a surface acoustic wave element having a piezoelectric film made of sapphire or diamond, which is a material for increasing the velocity of the surface acoustic wave has been developed, as described for example in Japanese Patent Laid-Open No. 64-62911.

The sonic speed in diamond is the highest amongst all the materials and is thermally and chemically stable. For this reason, diamond has received a great deal of attention as a substrate for forming a surface acoustic wave element. Of all the surface acoustic wave elements using diamond, a surface acoustic wave element in which a diamond thin film is formed on a substrate and a piezoelectric thin film is formed on this diamond thin film has received the most attention in favor of productivity and cost.

FIG. 14 is a schematic over view showing a conventional surface acoustic wave element using diamond.

Referring to FIG. 14, this surface acoustic wave element 30 has a substrate 31 made of, e.g., silicon, a diamond thin film 32 formed on the substrate 31, IDT electrode 36 and 37 patterned by etching a metal thin film on the diamond thin film 32, and a piezoelectric layer 38, e.g., a ZnO film formed on the surface of the diamond thin film 32 on which the IDT electrodes 36 and 37 are formed. The IDT electrodes 36 and 37 generate a surface acoustic wave.

A conventional material for the IDT electrodes 36 and 37 preferably has a low resistivity and is exemplified by Au, Ag, Al, Ti, W, Mo, or a combination of at least two metals such that Al formed on Ti. Of these materials, aluminum has generally been used as the IDT material because the electrodes can be easily formed, and because aluminum has a low specific gravity, can minimize the electric load mass effect, and has a high electric conductivity.

A material obtained by adding to aluminum an additive such as Ti, Ni, Mg, or Pd having good anti-migration properties is used as ]the material for the IDT to obtain a surface acoustic wave element as describe for example in Japanese Patent Laid-Open No. 3-40510.

The IDT electrodes are manufactured by the following conventional process.

An electrode metal is uniformly formed on the surface of a diamond thin film by an evaporation method, or a sputtering method. A resist is uniformly applied to the surface of the electrode metal, and a mask obtained by forming an electrode pattern on a transparent flat plate made of glass or the like is placed on the resist film. The resist film is exposed with a mercury lamp or the like to form a resist pattern. The resist pattern may be formed by an electron beam method. Using the resist having the desired electrode resist pattern, a wet etching method or an RIE (Reactive Ion Etching) method is used to form comb-like electrodes.

A surface acoustic wave element having the conventional aluminum electrodes, however, is easily degraded, and the aluminum electrodes are easily disrupted thereby causing failure. In particular, when the IDT electrodes are micropatterned on the order of submicrons, such failures tend to occur due to the stress by the substrate and or the thin film and piezoelectric distortions. The discontinuities of the IDT cause a defective surface acoustic wave element. As a result, reliability of the surface acoustic wave element is degraded.

The conventional aluminum electrodes are made of polycrystalline aluminum in which crystal grains are crystallographically nonuniformly oriented. The lattice constant of diamond is about 3.567 Å, and the lattice constant of Al is about 4.050 Å.

The lattice mismatching ratio of Al to diamond is 13.5%. In this manner, the lattice mismatching ratio of Al to diamond is so high that aluminum epitaxially grown on diamond becomes polycrystalline aluminum which has epitaxial defects, epitaxial damage, abnormally grown crystal grains, and nonuniformly oriented crystal grains. In an Al electrode consisting of polycrystalline aluminum having nonuniformly oriented crystal grains, slip occurs in the plane (111). Voids are formed in nonuniform crystal grains. When these voids grow, interconnection failures may occur.

When a signal having a high voltage level is applied to the Al electrode consisting of the polycrystalline aluminum having the nonuniformly oriented crystal grains, a strong stress acts on the aluminum electrode from the surface acoustic wave, thereby causing stress migration. When the stress migration has occurred, electrical short-circuiting, an increase in propagation loss, and characteristic degradation such as a decrease in Q value of the surface acoustic wave resonator (SAW resonator) occur. The aluminum electrodes are also degraded by stress migration caused by grain boundary diffusion.

In the surface acoustic wave element described in Japanese Patent Laid-Open No. 3-40510, although the antimigration characteristics are improved, this improvement is not satisfactory because an alloy mainly containing aluminum is used to form the electrodes of the surface acoustic wave element and uniform or almost uniform crystal grains of the electrode material cannot be formed on the surface of the diamond layer.

In the conventional method of manufacturing a surface acoustic wave element, it is often difficult to form electrodes in the form of micropatterned wiring by etching.

SUMMARY OF THE INVENTION

The present invention has been made in consideration of the conventional technical problems described above. An object of the present invention is to provide a surface acoustic wave element which has a high resistance to electromigration and stress migration, is almost free from degradation and failure, and exhibits good characteristics such as a low electric resistance.

In order to achieve the above object of the present invention, there is provided a surface acoustic wave element comprising a diamond layer, a piezoelectric thin film formed on the diamond layer, and a pair of electrodes for generating a surface acoustic wave having a specific wavelength and extracting the surface acoustic wave, wherein at least one of the electrodes is a copper electrode epitaxially grown on a surface of the diamond layer.

The diamond layer is preferably a single crystal diamond layer or a highly oriented polycrystalline diamond layer.

A method of manufacturing a surface acoustic wave element according to the present invention comprises the steps of forming a diamond layer on a substrate by epitaxial synthesis and forming a copper electrode having a predetermined shape on a surface of the diamond layer by epitaxial growth.

The step of forming the copper electrode having the predetermined shape preferably comprises the steps of forming an inverted pattern of an electrode pattern having a predetermined shape on the surface of the diamond layer and epitaxially growing copper on an exposed surface of the diamond layer using the inverted pattern as a mask.

The following functions and effects are achieved by the surface acoustic wave element having the above structure and by the method of manufacturing the same, according to the invention.

The lattice constant of diamond is about 3.567 Å, the lattice constant of Cu is about 3.620 Å, whereby the lattice mismatching ratio of Cu to diamond is 1.5%.

The lattice mismatching ratio of copper to diamond is low. Copper can be epitaxially grown on diamond.

As a result, when a single crystal diamond layer is used as the diamond layer and a copper electrode is formed on the surface of the single crystal diamond layer by epitaxial growth, the copper electrode has single crystal grains or almost single crystal grains and has high resistances to electromigration and stress migration.

When a highly oriented polycrystalline diamond layer is used as the diamond layer and a copper electrode is formed on the highly oriented polycrystalline diamond layer, the copper electrode has single crystal grains or almost single crystal grains and has high resistances to electromigration and stress migration.

Since the copper electrode has single crystal or almost single crystal grains, the slip plane of the grain boundary which causes formation of voids is not formed or rarely formed by migration. Also, the characteristic degradation and failure by stress migration due to grain boundary diffusion do not occur.

Copper has a lower electric resistance than aluminum and is superior to aluminum as an electrode material for the surface acoustic wave element .

The method of manufacturing a surface acoustic wave electrode is useful to form a micropatterned copper electrode on the order of submicrons.

The present invention will become more fully understood from the detailed description presented below and the accompanying drawings, which are given by way of illustration only, and thus are not to be considered as limiting the present invention.

The further scope of applicability of the present invention will become apparent from the following detailed description. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EXAMPLE EMBODIMENTS AND OF THE BEST MODE OF THE INVENTION

An embodiment of the present invention will be described with reference to the accompanying drawings.

Figure 1:
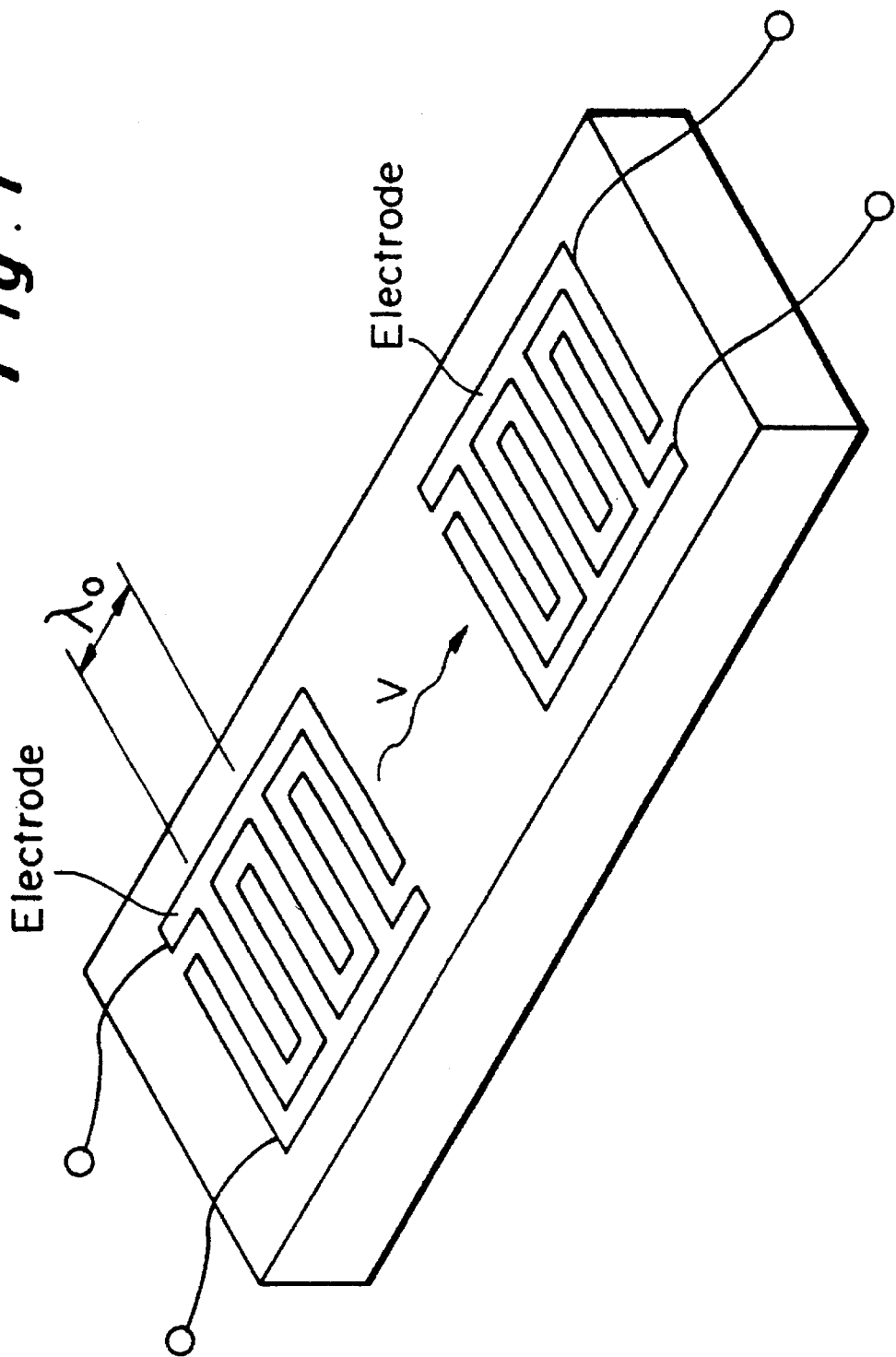
FIG. 1 is a schematic perspective view showing the general shape of a surface acoustic wave element employing the present invention so as to explain an embodiment of the present invention.

First, a method of manufacturing a surface acoustic wave element according to an embodiment of the present invention, namely a surface acoustic wave element having a general shape shown in FIG. 1, i.e., a pair of electrodes, will be described. Reference symbol $\lambda_0$ denotes a wavelength of the segments of each of the pair of electrodes ; and V denotes a propagation velocity of the surface acoustic wave. The frequency characteristics of the surface acoustic wave element having the above shape include a center frequency $f_0$ proportional to $V/\lambda_0$.

FIGS. 2 to 12 are schematic views for explaining the steps in manufacturing the surface acoustic wave element according to the embodiment of the present invention.

Figure 2:
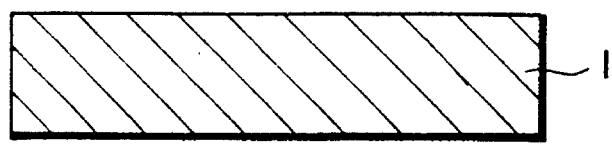
FIGS. 2 to 12 are cross sectional views for explaining the steps in manufacturing a surface acoustic wave element according to the present invention.

Referring to FIG. 2, a substrate 1 on which a diamond thin film is to be formed is prepared. The substrate 1 is not limited to a specific material, but is made of a semiconductor material (e.g., Si, Mo, W, GaAs, or $LiNbO_3$) or an inorganic material.

Figure 3:
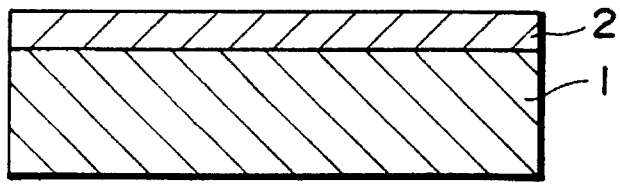

As shown in FIG. 3, a diamond thin film 2 is formed on the substrate 1. A method of forming the diamond thin film 2 on the substrate 1 is not limited to a specific one. A thermal CVD method (e.g., a thermal filament CVD method), a microwave plasma CVD method, a plasma CVD method, or a sputtering method may be used. A method of decomposing and exciting a source gas to grow diamond by epitaxial synthesis may include heating a thermocouple radiant material to a temperature of 1,500 K. or more to activate a source gas;

using a discharge generated by a DC, RF, or microwave field;

(3) using ion bombardment;

(4) radiating with light such as a laser beam; or (5) causing combustion of a source gas.

According to the present invention, the source material is generally a carbon-containing compound which is preferably used in combination with hydrogen gas and may also be used in combination with an oxygen-containing compound and/or an inert gas.

Examples of the carbon-containing compound are a paraffin-based hydrocarbon (e.g., methane, ethane, propane, or butane), an olefin-based hydrocarbon (e.g., ethylene, propylene, or butylene), an acetylene-based hydrocarbon (e.g., acetylene or allylene), a diolefin-based hydrocarbon (e.g., butadiene), an alicyclic hydrocarbon (e.g., cyclopropane, cyclobutane, cyclopentane, or cyclohexane), ketones (e.g., acetone, diethyl ketone, and benzophenone ), alcohols (e.g., methanol and ethanol), amines (trimethylamine and triethylamine), carbon dioxide gas, and carbon monoxide. These materials can be used singly or in a combination of at least two materials. Alternatively, the carbon-containing compound may be a material consisting of only carbon atoms, such as graphite, coal, or coke.

As the oxygen-containing compound, oxygen, water, carbon monoxide, carbon dioxide, or hydrogen peroxide is preferable because these are easily accessible.

Examples of the inert gas are argon, helium, neon, krypton, xenon, and radon.

To form a single crystal diamond layer on the substrate 1, a single crystal substrate for epitaxial synthesis is used as a nucleus, and the synthesis conditions are controlled for epitaxial synthesis. A diamond thin film can be epitaxially grown as described, for example, in C. Wild et al., 2nd International Symposium, Diamond Material, pp. 224 -(1991).

To form a highly oriented polycrystalline diamond layer on the substrate 1, a plurality of single crystal diamond materials having an aligned plane orientation are arranged on the substrate 1. Epitaxial synthesis conditions are controlled to epitaxially grow a diamond thin film on the substrate 1 on which the plurality of single crystal diamond materials having an aligned plane orientation have been arranged as described, for example, in M. W. Geis, Diamond and Related Materials, Vol. 1, pp. 684 - (1992).

Figure 4:
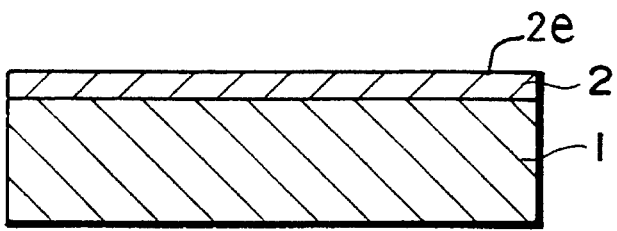

Referring to FIG. 4, a crystal growth end surface 2e of the diamond thin film 2 on the substrate 1 is mirror-polished.

Figure 5:
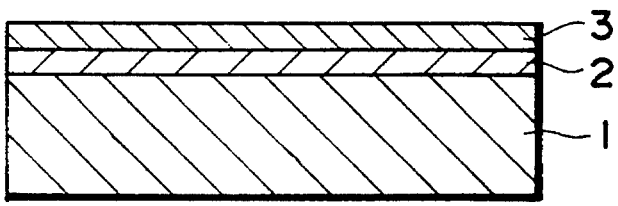

Referring to FIG. 5, a mask material 3 is uniformly formed on the crystal growth end face 2e of the diamond thin film 2. The mask material 3 is not limited to a specific material and can be $SiO_2$, SiN, or the like.

The mask material 3 consists of $SiO_2$, SiN, or the like because copper is to be epitaxially grown on the mirror-polished crystal growth end surface 2e of the diamond thin film 2 in accordance with a selective metal CVD method in the subsequent step as described, for example, in Y. Arita et al., IEEE IEDM 90, pp. 39–42, and T. Ohmi et al., IEEE IEDM 90, pp. 285–288 . A known CVD method, a sputtering method, or a deposition method can be used to uniformly form the mask material 3 on the surface of the diamond thin film 2.

Figure 6:
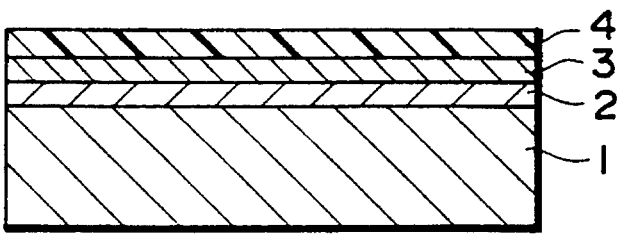
Figure 7:
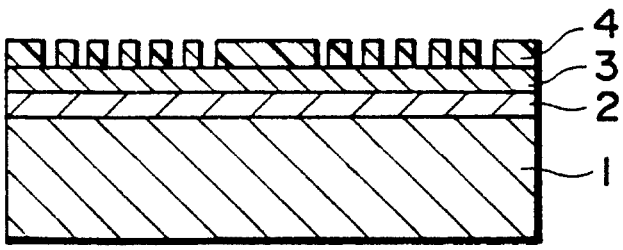

Referring to FIG. 6, a resist material 4 is uniformly applied to the surface of the mask material 3. The resist material 4 is not limited to a specific one, but a photoresist such as a photosensitive polymer can be used. The photoresist material can be a conventional photoresist material such as a novolak-naphthoquinone azido-based positive photoresist material or a negative photoresist consisting of cyclic isoprene rubber and aromatic bisazido. The resist material 4 is applied by a conventional coating method such as a spin coating method or a knife coating method.

Referring to Fig . 7, a resist pattern of the inverse of the desired electrode pattern is formed in the resist material 4. The resist pattern may be formed with UV (ultraviolet ray) or by subjecting the resist material 4 to direct drawing with an electron beam (EB).

Figure 8:
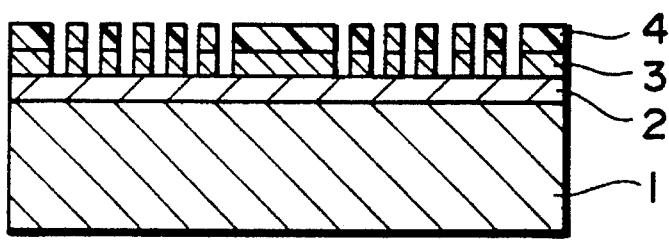

Referring to FIG. 8, the mask material 3 is etched by a conventional etching method such as a reactive ion etching method.

Figure 9:
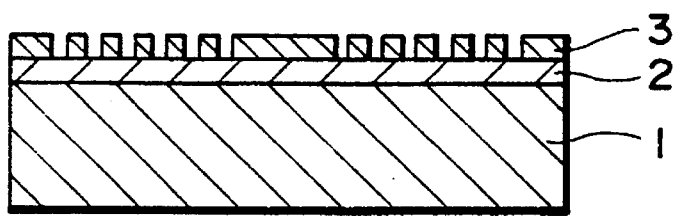

Referring to FIG. 9, the resist material 4 is removed.

Figure 10:
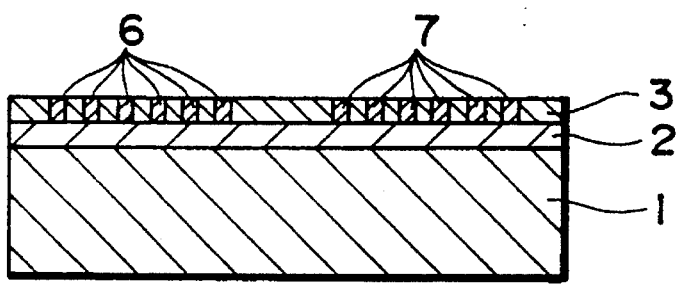
Figure 13:
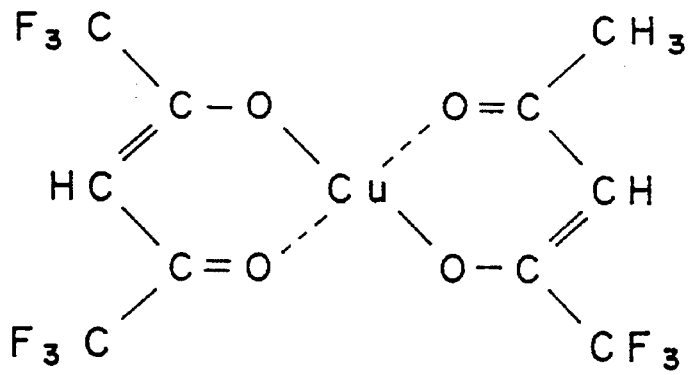
FIG. 13 is a diagram showing the chemical formula of a source material of copper for epitaxial growth copper.
Figure 14:
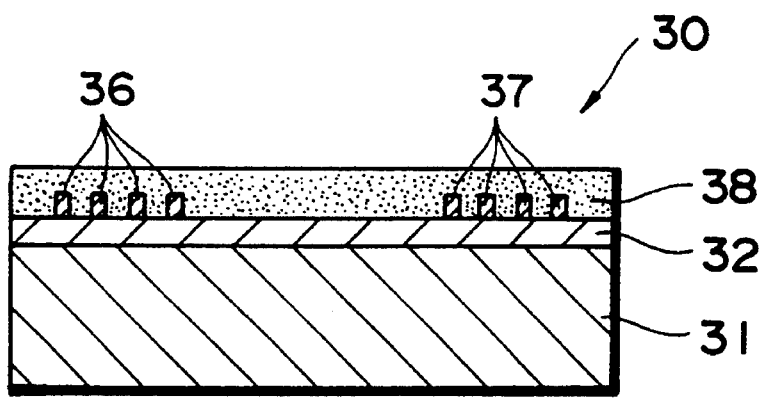
FIG. 14 is a cross sectional view for explaining the structure and manufacturing method of a conventional surface acoustic wave element.

Referring to FIG. 10, copper electrodes 6 and 7 are selectively grown on the diamond thin film 2 by epitaxial growth in accordance with the mask pattern formed in the mask material 3. A material for epitaxially growing the copper electrodes is a copper complex, e.g., a copper complex having the formula shown in FIG. 13.

Using $SiO_2$, SiN, or the like as a mask material, copper can be epitaxially grown on the exposed surface of the diamond thin film 2. This growth is selective epitaxial growth.

Figure 11:
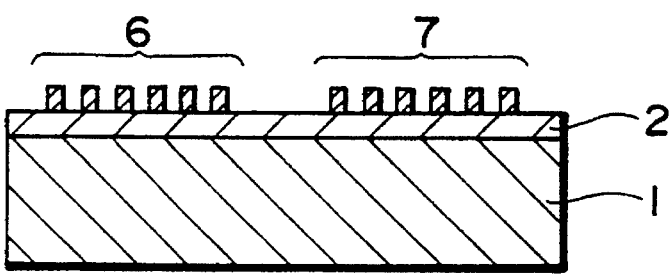

Referring to FIG. 11, the mask material 3 is removed by a wet etching method, a dry etching method, or a reactive ion etching method.

Figure 12:
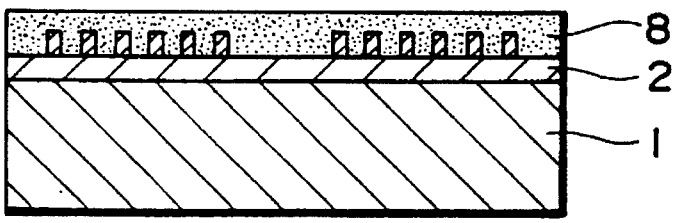

Referring to FIG. 12, a piezoelectric thin film 8 is formed by a CVD method. The piezoelectric thin film 8 used in the present invention can contain ZnO, AlN, $Pb(Zr,Ti)O_3$, $(Pb, La)(Zr,Ti)O_3$, $LiTaO_3$, $LiNbO_3$, $SiO_2$, $Ta_2O_5$, $Nb_2O_5$, BeO, $Li_2B_4O_7$, $KNbO_3$, ZnS, ZnSe, or CdS as a major component. The piezoelectric thin film 8 preferably has highly oriented polycrystalline grains.

In this embodiment, copper is epitaxially grown on the surface of the diamond thin film 2 by the selective metal CVD method to form the copper electrodes 6 and 7. Alternatively, the step of forming the copper electrodes 6 and 7 may be performed by uniformly epitaxially growing cooper on the surface of the conventional diamond thin film 2, then uniformly applying a resist material onto the surface of the copper thin film, and finally forming the copper electrodes using lithography and etching. In this embodiment, however, after the mask pattern is formed in the mask material as the inverse of the desired electrode pattern and the copper electrodes are selectively formed on the surface of the diamond thin film by epitaxial growth in accordance with the inverted pattern. Therefore, high-precision electrodes can be formed, which are almost free from damage resulting during the manufacture.

Therefore, the method of manufacturing a surface acoustic wave element according to the present invention is useful for manufacturing a surface acoustic wave element having electrodes each having a micropatterned wiring. Example 1

The present invention will be described in further detail by way of an example. A diamond thin film having a predominant orientation of (110) was formed on a silicon substrate by a thermal filament CVD method under the following conditions.

(Experimental Conditions)

Source Gas (flow rate): $CH_4/H_2=3\%$ (2 SLM)

Gas Pressure: 80 Torr

Filament Temperature: 2,200° C.

Substrate Temperature: 960° C.

Under the above conditions, the diamond thin film highly oriented in the (110) plane could be formed on the silicon substrate.

After a 50-μm thick diamond thin film was grown, a crystal growth end surface 2e of the diamond thin film was mirror-polished. A 0.2-μm thick $SiO_2$ mask material was uniformly deposited on the mirror-polished surface of the diamond thin film by the CVD method. Photoresist was formed on the surface of the mask material by the spin coating method. After the resultant structure was prebaked, the resist layer was exposed with UV (ultraviolet ray) using a photomask having a predetermined electrode pattern. The exposed resist layer wa developed rinsed, and post-baked to form a resist pattern in the resist layer that is the inverse of the desired electrode pattern represented by the pattern of the photomask of the photomask in the resist layer.

The $SiO_2$ of the mask layer was etched using the resist pattern, by reactive ion etching. The reaction gas was, e.g., a gas mixture of $OF_4$ and $H_2$ or a gas mixture of $CHF_3$ and $O_2$. Reactive ion etching was performed until the surface of the diamond thin film was exposed.

The resist was removed as in a conventional method, and the mask pattern which is the inverse of the electrode pattern of the photomask, was formed on the surface of the diamond thin film.

Copper was then selectively grown on the portions of the surface of the diamond thin film revealed by the mask pattern, by epitaxial growth. $Cu(hfa)_2$ diluted with hydrogen was introduced into a reaction chamber. The temperature of the substrate 1 was kept at 350° C., the temperature of the nozzle was kept at 120° C., and the temperature of the reaction chamber was kept at 70° C. A Cu thin film was selectively grown on a portion of the surface of the diamond thin film in accordance with the mask pattern. The copper thin film for the copper electrodes had a thickness of 0.1 μm. Therefore, the copper electrodes could be epitaxially grown on the surface of the diamond thin film. Then the $SiO_2$ was removed by the reactive ion etching method. The reaction gas was a gas mixture of $OF_4$ and $H_2$.

By the above operations, the copper electrodes could be epitaxially grown on the surface of the diamond thin film. When the copper electrode was extracted and observed, copper was almost uniform single crystal copper according to X-ray analysis. This determination may be performed using electron beam analysis.

The resultant copper electrode was an IDT electrodes having a thickness of 1,000 Å, an electrode width of 2 μm, and an electrode segment pitch of 2 μm. A 0.9 μm thick ZnO thin film as a piezoelectric thin film was formed on the diamond thin film having the copper comb-like IDT electrodes thereon. The ZnO thin film was formed using a magnetron sputtering apparatus.

As Comparative Example 1, a surface acoustic wave element was manufactured following the same procedures as in Example 1, except that the IDT electrodes having the same shape and size as those of Example 1 were formed of aluminum instead of copper.

As Comparative Example 2, a surface acoustic wave element was manufactured following the same procedures as in Example 1, except that the IDT electrodes having the same shape and size as those of Example 1 were formed using an aluminum alloy containing aluminum as a major component, 0.5% of Si, and 1.0% of Cu. The aluminum-type IDT electrodes themselves of Comparative Examples 1 and 2 were manufactured by a conventional method.

An RF wave was applied to the surface acoustic wave elements of Example 1 and Comparative Examples 1 and 2 such that a surface acoustic wave stress (SAW stress) was set to be $1.5 \times 10^5 N/m^2$, and characteristic degradation of these surface acoustic wave elements was measured. This measurement was performed by measuring the time elapsed until the center frequency of the surface acoustic wave was shifted by 500 kHz. The characteristic degradation of the surface acoustic wave element of Example 1 was not observed until 50 hours. However, the characteristic degradation of the surface acoustic wave element of Comparative Example 1 was observed in two hours, and the characteristic degradation of the surface acoustic wave element of Comparative Example 2 was observed in 10 hours.

As is apparent from the above results, the surface acoustic wave element according to the present invention has better anti-migration characteristics than those of the conventional surface acoustic wave elements. For this reason, characteristic degradation and failure tend not to occur, and high reliability can be assured.

From the invention thus described, it should be understood that the invention may be varied in many ways. Such variations are not to be regarded as a departure from the spirit and scope of the invention, and all such modifications as would be fairly understood by one skilled in the art are intended to be included within the scope of the following claims.

What is claimed is:

1. A method of manufacturing a surface acoustic wave element, comprising the following steps:

epitaxially forming a diamond layer on a substrate; and selectively epitaxially forming a copper layer on a portion of a surface of said diamond layer to form an electrode of said surface acoustic wave element.

2. The method according to claim 1, wherein said step of forming a copper layer comprises:

forming on said surface of said diamond layer a mask having a pattern that is the inverse of said portion of said surface; and epitaxially growing copper on said portion of said surface of said diamond layer, which surface portion is exposed by said inverse pattern of said mask to form said copper electrode.

3. The method of claim 1, wherein said portion of said surface of said diamond layer has a pattern of an interdigital transducer.

4. The method of claim 3, wherein said copper layer is formed according to said pattern to form said electrode of said surface acoustic wave element as an interdigital transducer electrode having a thickness of about 1000 Å, an electrode width of about 2 μm, and an electrode segment pitch of about 2 μm.

5. The method of claim 1, wherein said portion of said diamond layer surface is in a pattern having dimensions on the order of submicrons.

6. The method of claim 1, wherein said copper layer is formed to a thickness of about 0.1 μm.

7. The method of claim 1, wherein said diamond layer is formed as a single crystal diamond layer.

8. The method of claim 7, wherein said step of forming said diamond layer comprises providing a single crystal substrate material as a nucleus for diamond synthesis, and synthesizing diamond on said nucleus while controlling synthesis conditions for achieving epitaxial synthesis.

9. The method of claim 7, wherein said copper layer is formed to contain single crystal grains.

10. The method of claim 1, wherein said diamond layer is formed as a highly oriented polycrystalline diamond layer.

11. The method of claim 10, wherein said step of forming said diamond layer comprises providing a plurality of single crystal diamond members as nuclei for diamond synthesis, arranging said diamond members with a substantially aligned plane orientation on said substrate, and synthesizing diamond on said single crystal diamond members while controlling synthesis conditions for achieving epitaxial synthesis.

12. The method of claim 10, wherein said copper layer is formed to contain single crystal grains.

13. The method of claim 1, wherein said copper layer is formed to contain single crystal grains.

14. The method of claim 1, further comprising, between said step of forming said diamond layer and said step of forming said copper layer, forming a mask layer uniformly on said diamond layer, applying a resist layer uniformly on said mask layer, forming in said resist layer a pattern that is the inverse of said portion of said surface of said diamond layer, etching said mask layer through said pattern of said resist layer to uncover said portion of said surface of said diamond layer, and removing said patterned resist layer, and further comprising removing said mask layer after said step of selectively forming said copper layer.

15. The method of claim 1, wherein said step of selectively forming said copper layer comprises epitaxially growing a copper thin film uniformly on said surface of said diamond layer, applying a resist layer uniformly on said copper thin film, patterning said resist layer by lithography, and etching said copper thin film through said patterned resist layer to leave remaining said copper layer selectively on said portion of said diamond layer surface.

16. The method of claim 1, wherein said step of forming said copper layer comprises providing Cu(hexafluoroacetyl acetate)$_2$ as a copper source.

* * * * *

UNITED STATES PATENT AND TRADEMARK OFFICE
CERTIFICATE OF CORRECTION

PATENT NO. : 5,497,726
DATED : Mar. 12, 1996
INVENTOR(S) : Shikata et al.

It is certified that error appears in the above-identified patent and that said Letters Patent is hereby corrected as shown below:

OTHER PUBLICATIONS,
Title Page, right column, line 10, replace "Mettalurgy" by --Metallurgy--.

Column 1, line 66, after "wave" insert --,--.

Column 2, line 30, replace "a: ]the" by --as the--;
line 31, replace "describe" by --described--.

Column 5, line 21, before "heating" insert --(1)--;
line 23, before "using" insert --(2)--.

Column 6, line 60, replace "cooper" by --copper--.

Column 7, line 31, replace "wa" by --was--;
line 34, delete "in the resist layer";
line 37, replace "OF$_4$" by --CF$_4$--.
line 57, replace "OF$_4$" by --CF$_4$--;
line 64, replace "electrodes" by --electrode--.

Column 8, line 19, after "and" insert --the--.

Signed and Sealed this

Second Day of July, 1996

Attest:

BRUCE LEHMAN

Attesting Officer

Commissioner of Patents and Trademarks